(12) United States Patent
Akahane

(10) Patent No.: US 10,063,226 B2
(45) Date of Patent: Aug. 28, 2018

(54) LEVEL SHIFT CIRCUIT

(71) Applicant: FUJI ELECTRIC CO., LTD., Kawasaki-shi, Kanagawa (JP)

(72) Inventor: Masashi Akahane, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/909,955

(22) Filed: Mar. 1, 2018

(65) Prior Publication Data

US 2018/0191340 A1 Jul. 5, 2018

Related U.S. Application Data

(63) Continuation of application No. PCT/JP2017/002667, filed on Jan. 26, 2017.

(30) Foreign Application Priority Data

Mar. 17, 2016 (JP) ................................ 2016-054420

(51) Int. Cl.
*H03K 19/0175* (2006.01)
*H03K 17/16* (2006.01)
(Continued)

(52) U.S. Cl.
CPC ........... *H03K 17/16* (2013.01); *H03K 17/687* (2013.01); *H03K 19/0948* (2013.01); *H03K 19/0185* (2013.01)

(58) Field of Classification Search
CPC ................. H03K 17/14; H03K 17/145; H03K 19/018521; H03K 19/018528; H03K 19/0175
See application file for complete search history.

(56) References Cited

U.S. PATENT DOCUMENTS 8,253,472 B2 * 8/2012 Nishijima ...... H03K 19/018521
327/333
9,294,093 B2 * 3/2016 Akahane .......... H03K 3/356182
(Continued)

FOREIGN PATENT DOCUMENTS

EP  2645572 A1  10/2013
EP  2822180 A1  1/2015
(Continued)

*Primary Examiner* — Hai L Nguyen
(74) *Attorney, Agent, or Firm* — Rabin & Berdo, P.C.

(57) ABSTRACT

A level shift circuit including serially-connected first resistor and first transistor and serially-connected second resistor and second transistor, a protection circuit that receives signals at a first junction between the first resistor and the first transistor and a second junction between the second resistor and the second transistor, a latch circuit receiving an output of the protection circuit, serially-connected third and fourth transistors and serially-connected fifth and sixth transistors respectively connected in parallel to the first and second resistors, a switching time detection circuit that receives the signals at the first and second junctions and detects an occurrence of switching noise, and first and second logical AND circuits that receive outputs of the switching time detection circuit and the signals at the first and second junctions, and respectively control the fourth and sixth transistors. The third and fifth transistors are controlled by an output, or an inversion thereof, of the latch circuit.

4 Claims, 6 Drawing Sheets

(51) Int. Cl.
    *H03K 17/687*     (2006.01)
    *H03K 19/0948*     (2006.01)
    H03K 19/0185     (2006.01)

(56) References Cited

U.S. PATENT DOCUMENTS

| | | |
|---|---|---|
| 9,722,610 B2 * | 8/2017 | Akahane ........ H03K 19/018521 |
| 2003/0179020 A1 | 9/2003 | Yoshida et al. |
| 2011/0134710 A1 | 6/2011 | Akahane |
| 2012/0081149 A1 | 4/2012 | Akahane |
| 2013/0278319 A1 | 10/2013 | Akahane |
| 2013/0293247 A1 | 11/2013 | Akahane |
| 2014/0292392 A1 | 10/2014 | Akahane |

FOREIGN PATENT DOCUMENTS

| | | |
|---|---|---|
| JP | 2003-273715 A | 9/2003 |
| JP | 2012-075267 A | 4/2012 |
| JP | 2013-179501 A | 9/2013 |
| JP | 2013-219714 A | 10/2013 |
| JP | 5354417 B2 | 11/2013 |
| JP | 5402852 B2 | 1/2014 |
| JP | 2014-158192 A | 8/2014 |
| WO | WO-2012/070174 A1 | 5/2012 |

* cited by examiner

LEVEL SHIFT CIRCUIT

CROSS-REFERENCE TO RELATED APPLICATION

This application is a continuation application of International Application PCT/JP2017/002667 filed on Jan. 26, 2017 which designated the U.S., which claims priority to Japanese Patent Application No. 2016-054420, filed on Mar. 17, 2016, the entire contents of which are incorporated herein by reference.

BACKGROUND OF THE INVENTION

1. Field of the Invention

The embodiments discussed herein are related to a level shift circuit.

2. Background of the Related Art

In a half-bridge circuit that is driven by a high-potential power supply, the switching elements on the high side and the low side that are connected in series are driven by driving circuits that have different reference potentials. A high voltage driver integrated circuit (or "HVIC") is known as a high-side driving circuit. In an HV driver IC, since a signal which has been generated with the low-side ground potential as a reference is not directly usable as the signal that switches the high-side switching element on or off, the signal is used after its level has been shifted by a level shift circuit (see, for example, Japanese Patent No. 5,402,852 (Paragraphs [0120] to [0133], FIG. 15) and Japanese Patent No. 5,354,417 (Paragraphs [0033] to [0041], FIG. 1)). The level shift circuits disclosed in Japanese Patent No. 5,402,852 and Japanese Patent No. 5,354,417 will now be described in order.

FIG. 5 depicts an example configuration of a half-bridge circuit that uses a conventional level shift circuit.

In FIG. 5, a high-side switching element XD1 and a low-side switching element XD2 are connected in series to construct an output circuit 100 that has a high-voltage power supply E (whose voltage is also indicated hereinafter as "E") connected to both ends. Here, in the illustrated example, N-channel power MOSFETs (Metal-Oxide-Semiconductor Field-Effect Transistors) are used as the switching elements XD1 and XD2.

This half-bridge circuit is configured so that the high-side switching element XD1 is controlled by an output signal HO of a high-side driving circuit 110 and the low-side switching element XD2 is controlled by an output signal LO of a low-side driving circuit 120.

The high-side driving circuit 110 is equipped with a high-side driver 111 that drives the switching element XD1, a power supply E1 (whose voltage is also indicated hereinafter as "E1"), and a level shift circuit of the other component elements.

The level shift circuit includes a series circuit of a level shift resistor LSR1 and an N-channel MOSFET high breakdown voltage transistor HVN1 and a series circuit of a level shift resistor LSR2 and an N-channel MOSFET high breakdown voltage transistor HVN2. These series circuits are connected at one end to a power supply line VB (whose potential is also indicated hereinafter as "VB") that is connected to a high potential-side terminal of the power supply E1 and at another end to ground potential (GND) that is the low-side reference potential. A set signal SET that indicates start timing of an on period of the switching element XD1 is inputted into the gate of the high breakdown voltage transistor HVN1. A reset signal RSET that indicates end timing of the on period of the switching element XD1 is inputted into the gate of the high breakdown voltage transistor HVN2. Note that the capacitors connected between the sources and drains of the high breakdown voltage transistors HVN1 and HVN2 indicate the parasitic capacitances Cds1 and Cds2 of the high breakdown voltage transistors HVN1 and HVN2.

A junction setdrn (whose signal is also indicated hereinafter as the "set drain signal setdrn") between the level shift resistor LSR1 and the high breakdown voltage transistor HVN1 is connected to a latch malfunction protection circuit 112. The junction resdrn between the level shift resistor LSR2 and the high breakdown voltage transistor HVN2 (whose signal is also indicated hereinafter as the "reset drain signal resdrn") is also connected to the latch malfunction protection circuit 112. Here, the latch malfunction protection circuit 112 operates so as to pass the set drain signal setdrn and the reset drain signal resdrn without amendment only when one out of the junctions setdrn and resdrn is at an L level and the other junction is at an H level.

The outputs of the latch malfunction protection circuit 112 are connected to a latch circuit 113, and the output of the latch circuit 113 is connected to the high-side driver 111. The output of the latch circuit 113 is also connected to the input of an inverter circuit INV1 and the output of the inverter circuit INV1 is connected to an input of an inverter circuit INV2. The output of the inverter circuit INV1 is also connected to one end of a series circuit of a resistor R11 and a resistor R12, and the other end of this series circuit is connected to the junction setdrn. A midpoint between the resistor R11 and the resistor R12 is connected to the gate of a P-channel MOSFET transistor PM2 connected in parallel to the level shift resistor LSR2. The output of the inverter circuit INV2 is connected to one end of a series circuit of a resistor R13 and a resistor R14, and the other end of this series circuit is connected to the junction resdrn. A midpoint between the resistors R13 and the resistor R14 is connected to the gate of a P-channel MOSFET transistor PM1 connected in parallel to the level shift resistor LSR1.

The level shift circuit also includes diodes D1 and D2 whose anodes are connected to a junction VS (whose potential is hereinafter also indicated as the "high-side reference potential VS") between the switching element XD1 and the switching element XD2. The cathode of the diode D1 is connected to the junction setdrn and the cathode of the diode D2 is connected to the junction resdrn. The diodes D1, D2 are provided to clamp the voltages of the junctions setdrn and resdrn so as not to exceed the high-side reference potential VS and so prevent an overvoltage from being inputted into the latch malfunction protection circuit 112.

The low-side driving circuit 120 includes a low-side driver 121 that drives the switching element XD2 and a power supply E2. The low-side driver 121 is supplied with power from the power supply E2, inputs a low-side control signal, and outputs the output signal LO for on/off driving of the switching element XD2.

One end of a load L is connected to the junction VS between the switching element XD1 and the switching element XD2 of the output circuit 100, that is, to a power supply line that is at the high-side reference potential, and the other end of the load L is connected to the ground potential (GND) that is the reference potential of the low-side driving circuit 120.

For a half-bridge circuit like this, consider a case where there is a switch from a state where the low-side switching element XD2 is on to a state where the high-side switching element XD1 is on.

When the low-side switching element XD2 is turned off and the high-side switching element XD1 is turned on, the high-side reference potential VS of the junction VS switches suddenly from the ground potential to the high voltage E. Due to this, the voltage E1 of the power supply E1 is added to the potential VB of the power supply line VB of the high-side driving circuit 110, so that the voltage relative to the ground potential is (E+E1). At this time, when the high breakdown voltage transistors HVN1 and HVN2 are off, the potential VB is applied via the level shift resistors LSR1 and LSR2 to both the junctions setdrn and resdrn. Since the two input signals are both H-level signals, the latch malfunction protection circuit 112 blocks the passage of the set drain signal setdrn and the reset drain signal resdrn, so that the latch circuit 113 is kept in a state where the high-side switching element XD1 is turned on.

However, since the high breakdown voltage transistors HVN1 and HVN2 have the respective parasitic capacitances Cds1 and Cds2, so-called CR circuits are formed by the level shift resistors LSR1 and LSR2 and the parasitic capacitances Cds1 and Cds2. Since the voltage (E+E1) is applied to these CR circuits, until the parasitic capacitances Cds1 and Cds2 become completely charged, an error signal called "dV/dt noise" or "switching noise" is superimposed on the junctions setdrn and resdrn.

During charging of the parasitic capacitances Cds1 and Cds2, the potentials of the junctions setdrn and resdrn are at the L level, and since both input signals are at the L level, the latch malfunction protection circuit 112 will block passage of the set drain signal setdrn and the reset drain signal resdrn. However, there is a tendency for the magnitudes of the parasitic capacitances Cds1 and Cds2 to differ due to manufacturing variations. When the difference in magnitudes is relatively large, the timing at which the potentials of the junctions setdrn and resdrn change from the L level to the H level will differ, which results in the latch malfunction protection circuit 112 passing the set drain signal setdrn or the reset drain signal resdrn. In addition, when "V(t)" is the voltage applied to the CR circuit, "Vx" is the voltage at the CR junction, and k is the gradient of the rise in V(t), the magnitude of the dV/dt noise on the high side is expressed as $$V(t)-Vx=kCR(1-\exp(-t/CR))$$

(see, for example, Expression (13) in Japanese Patent No. 5,402,852). From this expression, the larger the capacitance and resistance of the level shift circuit, and the more sudden the change in Vx, the larger the dV/dt noise. It is therefore understood that the larger the difference in magnitude between the parasitic capacitances Cds1 and Cds2, the greater the influence of this difference. Accordingly, when the difference in magnitude between the parasitic capacitances Cds1 and Cds2 is large, this results in the same operation being performed as when the set signal SET or the reset signal RSET is inputted, which leads to the half-bridge circuit malfunctioning.

To eliminate such malfunctioning, the resistances of the level shift resistors LSR1 and LSR2 are varied in keeping with the state of the output signal of the latch circuit 113 in a direction where the state of the output signal of the latch circuit 113 is maintained. That is, when the output signal of the latch circuit 113 is at the H level, an L level that has been inverted by the inverter circuit INV1 is applied to the resistor R11. Since this L level of the output of the inverter circuit INV1 is equal to the high-side reference potential VS, the gate voltage of the transistor PM2 is pulled down, which places the transistor PM2 in an on state. At the same time, an H level produced by further inversion by the inverter circuit INV2 is applied to the resistor R13. Since this H level of the output of the inverter circuit INV2 is equal to the potential VB, the gate voltage of the transistor PM1 is pulled up, which places the transistor PM1 in an off state. Due to this, (combined resistance of the level shift resistor LSR1 and the resistance between the source and drain of the transistor PM1)>(combined resistance of the level shift resistor LSR2 and the on resistance of the transistor PM2), so that even when dV/dt noise is produced, the potential of the reset drain signal resdrn is unlikely to fall compared to the potential of the set drain signal setdrn. Out of these potentials, since it is the set drain signal setdrn that is likely to individually fall to the L level due to the dV/dt noise, a situation where the latch circuit 113 is erroneously reset and the state of the output signal changes is avoided. Note that the on resistance (impedance) of the transistor PM2 that forms a combined resistance with the level shift resistor LSR2 is decided by the ratio of the resistances of the resistor R11 and the resistor R12. When the output signal of the latch circuit 113 is at the L level, conversely the set drain signal setdrn becomes unlikely to fall, so that a situation where the latch circuit 113 is erroneously set and the state of the output signal changes is avoided.

FIG. 6 depicts another example configuration of a half-bridge circuit that uses a conventional level shift circuit. In FIG. 6, component elements that are the same as or the equivalents of the component elements depicted in FIG. 5 have been assigned the same reference numerals and detailed description thereof is omitted.

The level shift circuit depicted in FIG. 6 includes a logical OR circuit OR1 and P-channel MOSFET transistors PM3 and PM4 that are connected in parallel to the level shift resistors LSR1 and LSR2. The inputs of the logical OR circuit OR1 are connected to the junctions setdrn and resdrn of the level shift outputs and the output of the logical OR circuit OR1 is connected to the gates of the transistors PM3 and PM4.

Here, in a state where the low-side switching element XD2 is off, the high-side switching element XD1 is on, and the potential VB of the power supply line VB rises, when the high breakdown voltage transistors HVN1 and HVN2 are off, the potentials of the junctions setdrn and resdrn fall due to the presence of the parasitic capacitances Cds1 and Cds2 of the high breakdown voltage transistors HVN1 and HVN2. On detecting that the potentials of both junctions setdrn and resdrn have dropped below a logical threshold, the logical OR circuit OR1 outputs an L level, and the transistors PM3 and PM4 connected in parallel to the level shift resistors LSR1 and LSR 2 turn on.

By doing so, the potentials of the junctions setdrn and resdrn are both pulled up to the H level. Although detailed description is omitted here, with this configuration, when dV/dt noise occurs in a state where there is a difference in magnitude between the parasitic capacitances Cds1 and Cds2, a junction out of the junctions setdrn and resdrn into which a regular signal is inputted will become the L level or both junctions will become the L level or the H level, so that a situation where the latch circuit 113 is erroneously set or reset is avoided.

Although the high-side reference potential VS rises when the low-side switching element XD2 is off and the high-side switching element XD1 switches from the off state to the on state, aside from this, there are also other situations where the high-side reference potential VS rises. One example is a case where the load L is an inductive load and a current that flows from the load L into the output circuit 100 is not capable of being quickly cut off during the dead time where both of the switching elements XD1 and XD2 are off. In this case, the current that has flowed into the output circuit 100 from the load L charges the stray capacitance of the line at the high-side reference potential VS, so that the high-side reference potential VS rapidly rises and dV/dt noise occurs. Compared to dV/dt noise that is generated momentarily when the high-side switching element XD1 is switched from an off state to an on state, it is common for this type of dV/dt noise to be sustained for long time by the load L.

However, since the level shift circuits in FIGS. 5 and 6 give no consideration to the application of dV/dt noise to the junction VS for an extended period, it has been confirmed that when dV/dt noise is applied for an extended period, malfunctioning may occur due to the influence of manufacturing variations in the parasitic capacitances Cds1 and Cds2. In an example state where the magnitude of the parasitic capacitance Cds2 is smaller than the magnitude of the parasitic capacitance Cds1, it is believed that when the difference in the influence of the dV/dt noise expressed by the equation $V(t)-Vx=kCR(1-\exp(-t/CR))$ between the junction resdrn and the junction setdrn is larger than the effect of the circuitry provided as a countermeasure, the potential of the junction resdrn will rise, as time passes the potential of the junction resdrn will reach the H level before the junction setdrn, the condition that protects the latch will be removed, and the latch will be erroneously set, resulting in the switching element XD1 being turned on.

SUMMARY OF THE INVENTION

According to an aspect of the present disclosure, there is provided a level shift circuit for shifting a level of a signal and transmitting the level-shifted signal to a circuit that drives a switching element on a high side of a half-bridge circuit, the circuit being connected to two ends of a power supply respectively via a power supply line and a reference potential line, the level shift circuit including: a first series circuit of a first resistor and a first transistor, the first series circuit being connected between the power supply line and a ground potential; a second series circuit of a second resistor and a second transistor, the second series circuit being connected between the power supply line and the ground potential; a latch malfunction protection circuit that receives a signal at a first junction between the first resistor and the first transistor, and a signal at a second junction between the second resistor and the second transistor; a latch circuit into which an output of the latch malfunction protection circuit is inputted; a third transistor and a fourth transistor that are connected to each other in series and are connected in parallel to the first resistor; a fifth transistor and a sixth transistor that are connected to each other in series and are connected in parallel to the second resistor; a switching time detection circuit that receives the signal at the first junction and the signal at the second junction and detects an occurrence of switching noise on the reference potential line; a first logical AND circuit that receives a first output of the switching time detection circuit and the signal at the first junction, and controls the sixth transistor; and a second logical AND circuit that receives a second output of the switching time detection circuit and the signal at the second junction, and controls the fourth transistor, wherein the third transistor is controlled by an output signal of the latch circuit and the fifth transistor is controlled by a signal produced by logically inverting the output signal of the latch circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described in detail below with reference to the accompanying drawings. Note that in the following description, potentials, voltages, signals, and the like at junctions, junctions with lines, and lines may use the same symbols as the junctions and lines.

Figure 1:
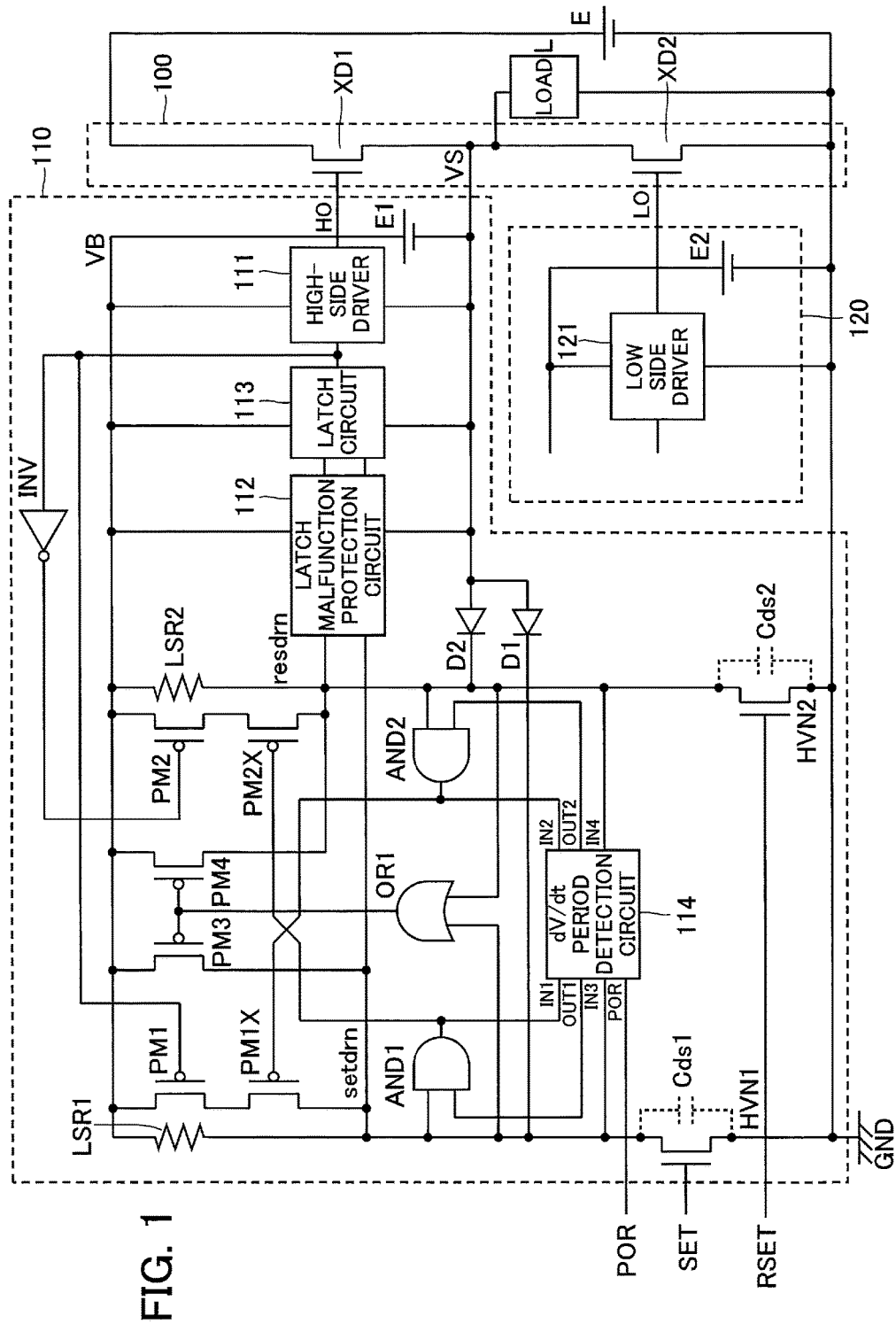
FIG. 1 is a circuit diagram depicting an example configuration of a half-bridge circuit that uses a level shift circuit according to an embodiment.
Figure 2:
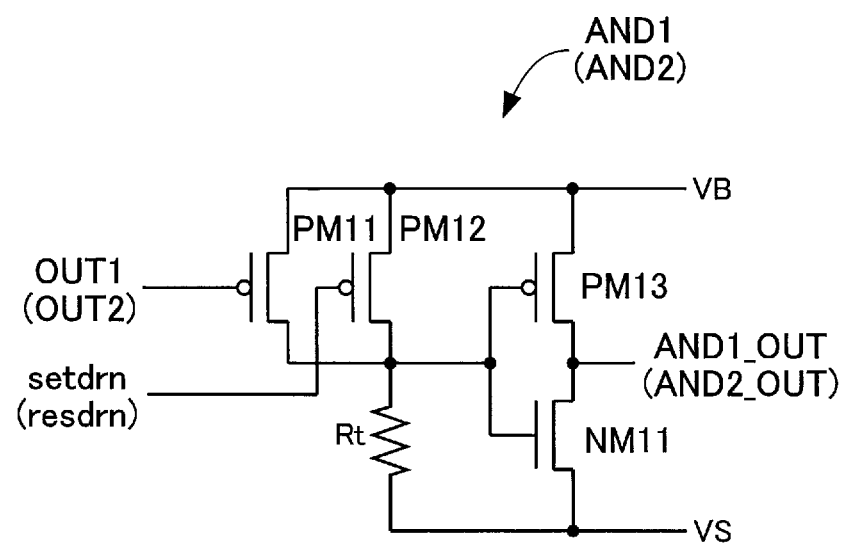
FIG. 2 is a circuit diagram depicting an example configuration of a logical AND circuit.
Figure 3:
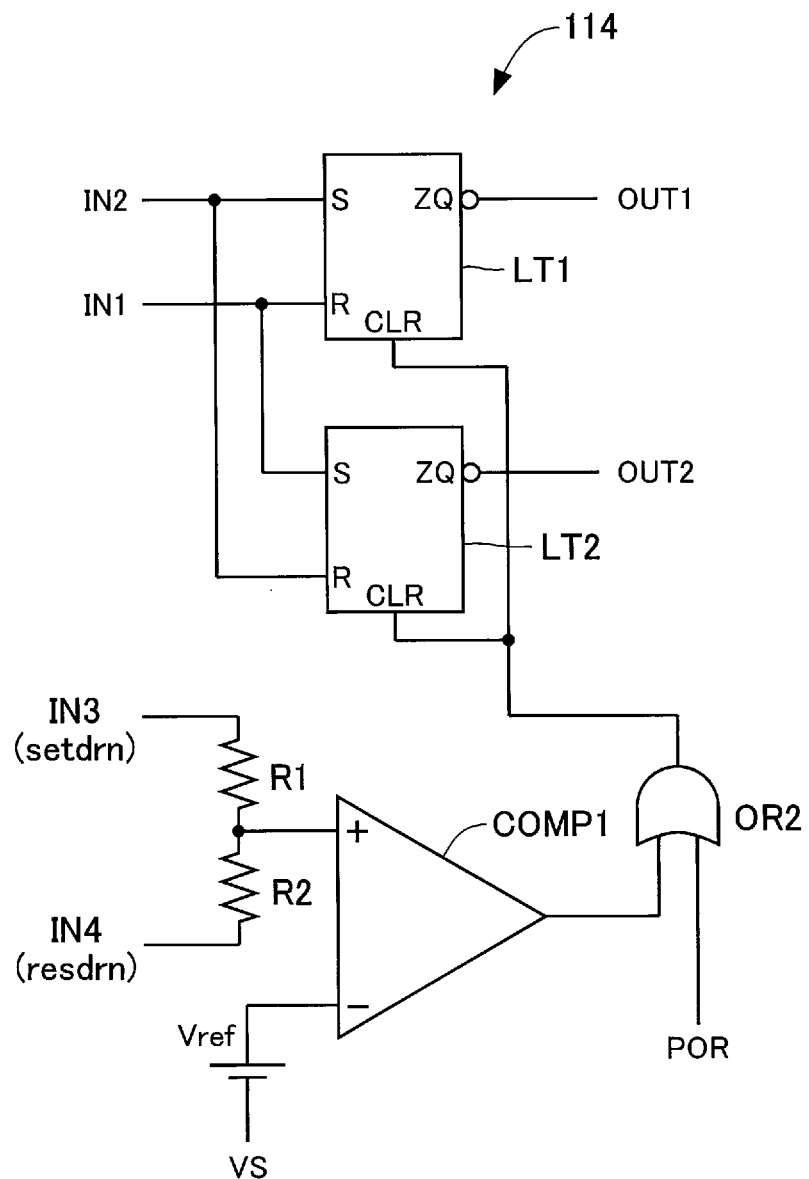
FIG. 3 is a circuit diagram depicting an example configuration of a dV/dt period detection circuit (a switching time detection circuit)
Figure 4:
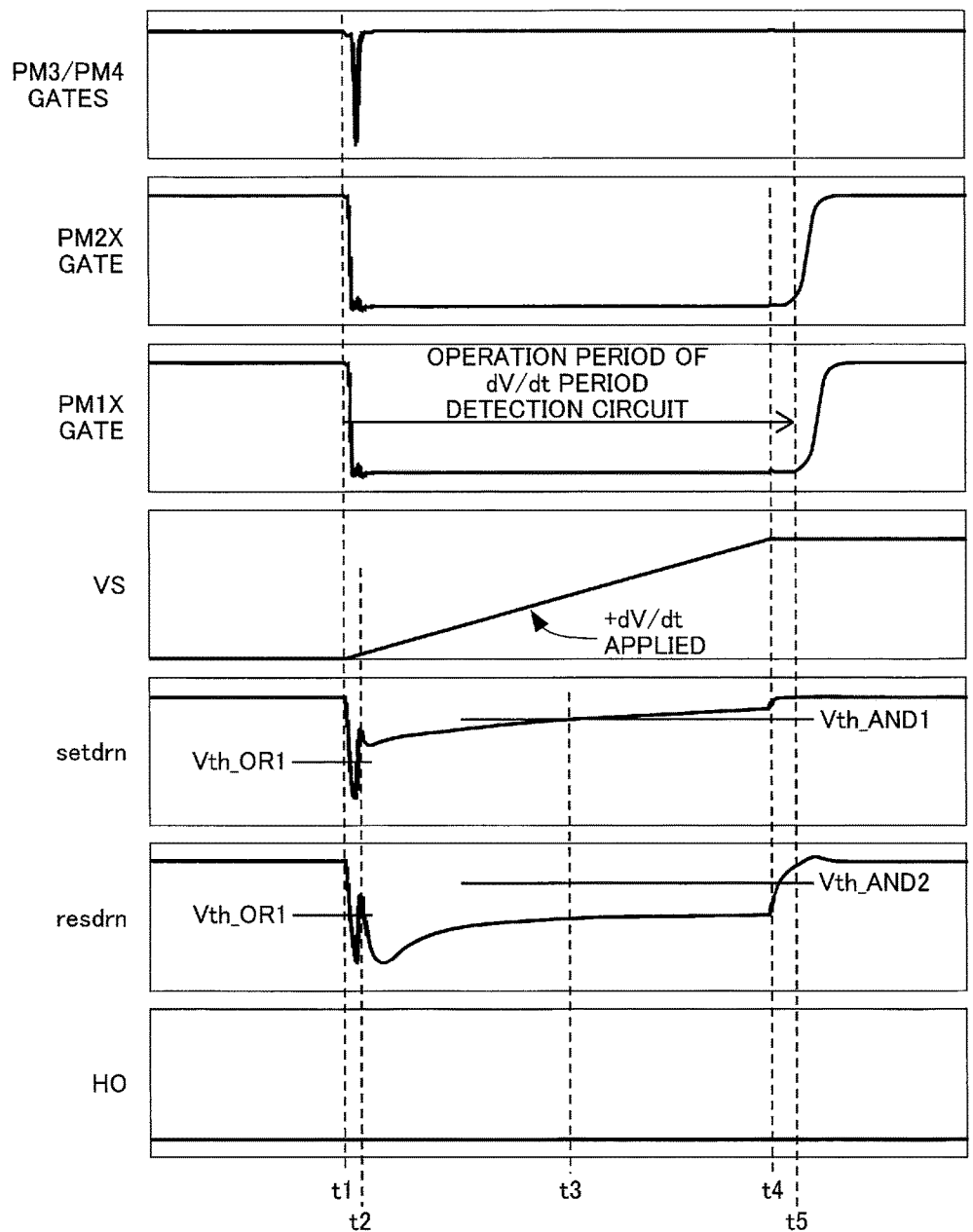
FIG. 4 depicts operation waveforms of the level shift circuit.
Figure 5:
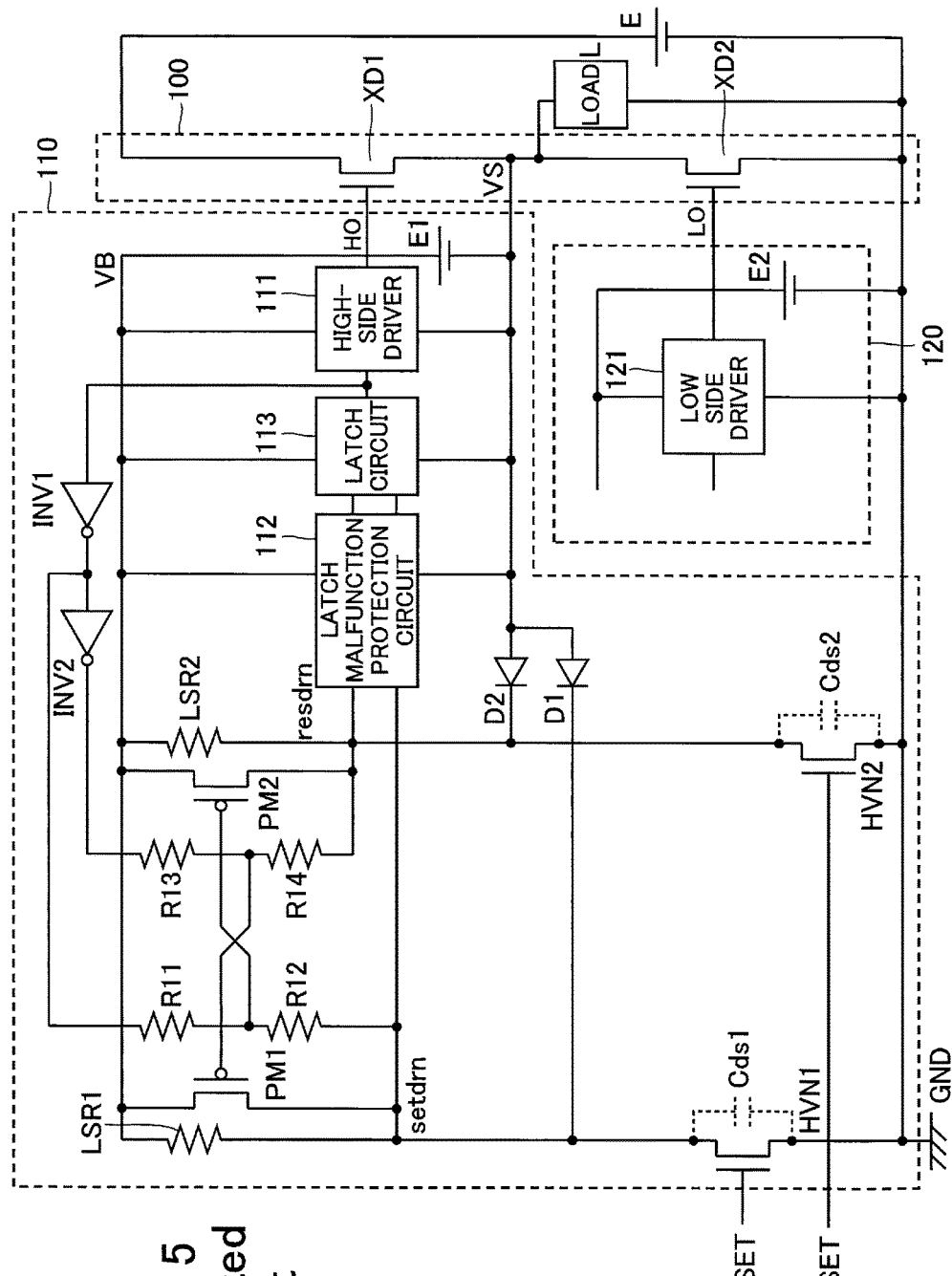
FIG. 5 depicts an example configuration of a half-bridge circuit that uses a conventional level shift circuit.
Figure 6:
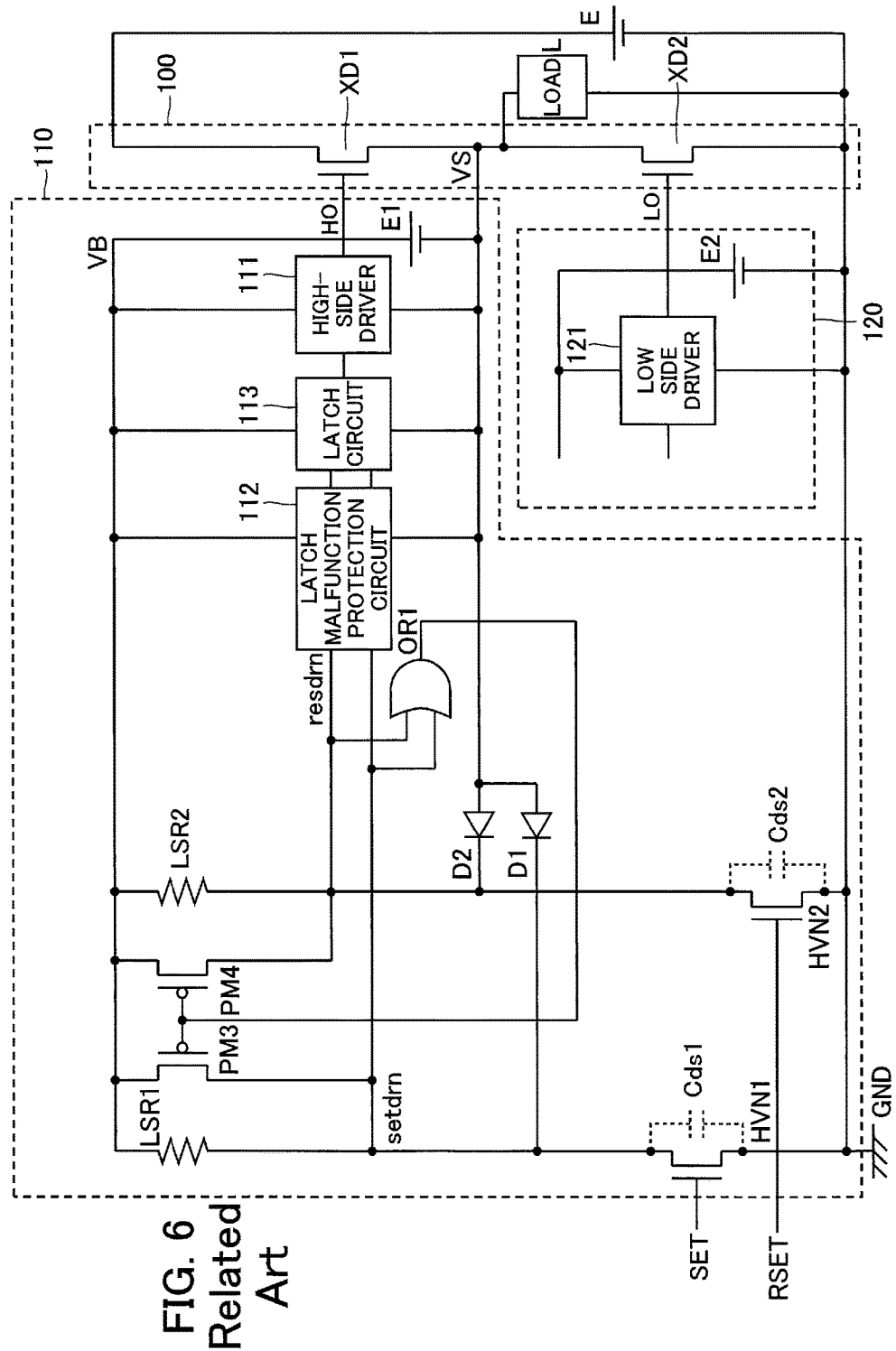
FIG. 6 depicts another example configuration of a half-bridge circuit that uses a conventional level shift circuit.

FIG. 1 is a circuit diagram depicting an example configuration of a half-bridge circuit that uses a level shift circuit according to an embodiment, FIG. 2 is a circuit diagram depicting an example configuration of a logical AND circuit, FIG. 3 is a circuit diagram depicting an example configuration of a dV/dt period detection circuit (a switching time detection circuit), and FIG. 4 depicts operation waveforms of the level shift circuit. In FIG. 1, since parts aside from the level shift circuit are the same as the component elements depicted in FIGS. 5 and 6, corresponding component elements have been assigned the same reference numerals.

In the half-bridge circuit in FIG. 1, the high-side switching element XD1 and the low-side switching element XD2 are connected in series to construct the output circuit 100 that has the high-voltage power supply E connected to both ends. Here, in the illustrated example, the switching elements XD1 and XD2 use N-channel power MOSFETs.

The high-side switching element XD1 has its gate connected to the output of the high-side driving circuit 110 and is subjected to on-off control by being driven by the output signal HO of the high-side driving circuit 110. The low-side switching element XD2 has its gate connected to the output of the low-side driving circuit 120 and is subjected to on-off control by being driven by the output signal LO of the low-side driving circuit 120.

The high-side driving circuit 110 is equipped with the high-side driver 111 that drives the switching element XD1, the high-side power supply E1, and a level shift circuit of the other component elements.

The level shift circuit includes a series circuit of the level shift resistor LSR1 and the N-channel MOSFET high breakdown voltage transistor HVN1 and a series circuit of the level shift resistor LSR2 and the N-channel MOSFET high breakdown voltage transistor HVN2. One end of each of these series circuits is connected to the power supply line VB that is connected to the high potential-side terminal of the power supply E1 and the other ends are connected to the ground potential (GND) that is the low-side reference potential. P-channel MOSFET transistors PM1 and PM1X connected in series are connected in parallel to the level shift resistor LSR1. P-channel MOSFET transistors PM2 and PM2X connected in series are connected in parallel to the level shift resistor LSR2. The P-channel MOSFET transistor PM3 is connected in parallel to the level shift resistor LSR1, and the P-channel MOSFET transistor PM4 is connected in parallel to the level shift resistor LSR2.

A set signal SET that indicates start timing of the on period of the switching element XD1 is inputted from a control circuit, not illustrated, into the gate of the high breakdown voltage transistor HVN1. A reset signal RSET that indicates end timing of the on period of the switching element XD1 is inputted from a control circuit, not illustrated, into the gate of the high breakdown voltage transistor HVN2. The capacitors connected between the sources and drains of the high breakdown voltage transistors HVN1 and HVN2 are the parasitic capacitances Cds1 and Cds2 of the high breakdown voltage transistors HVN1 and HVN2.

The junction setdrn between the level shift resistor LSR1 and the high breakdown voltage transistor HVN1 and the junction resdrn between the level shift resistor LSR2 and the high breakdown voltage transistor HVN2 are both connected to the latch malfunction protection circuit 112. The latch malfunction protection circuit 112 determines whether the state of the signals of the setdrn and resdrn junctions is a condition that causes a malfunction. On determining that the states are the condition that causes a malfunction, the latch malfunction protection circuit 112 blocks the passage of the signals. The condition that causes a malfunction is when the potentials of the junctions setdrn and resdrn are both at the H level or at the L level. On judging that the states are not the condition that causes the malfunction, latch malfunction protection circuit 112 passes the signals of the junctions setdrn and resdrn without amendment.

The outputs of the latch malfunction protection circuit 112 are connected to the latch circuit 113, and the output of the latch circuit 113 is connected to the high-side driver 111. The output of the latch circuit 113 is also connected to the gate of the transistor PM1. The output of the latch circuit 113 is further connected to the input of an inverter circuit INV, and the output of the inverter circuit INV is connected to the gate of the transistor PM2.

The level shift circuit also includes the logical OR circuit OR1, a logical AND circuit AND1, a logical AND circuit AND2, and a dV/dt period detection circuit (a switching time detection circuit) 114. The inputs of the logical OR circuit OR1 are respectively connected to the junctions setdrn and resdrn, and the output of the OR circuit OR1 is connected to the respective gates of the transistors PM3 and PM4. The inputs of the logical AND circuit AND1 are respectively connected to the junction setdrn and an output OUT1 of the dV/dt period detection circuit 114, and the output of the logical AND circuit AND1 is connected to the gate of the transistor PM2X and to an input IN1 of the dV/dt period detection circuit 114. The inputs of the logical AND circuit AND2 are respectively connected to the junction resdrn and an output OUT2 of the dV/dt period detection circuit 114, and the output of the logical AND circuit AND2 is connected to the gate of the transistor PM1X and to an input IN2 of the dV/dt period detection circuit 114. At the dV/dt period detection circuit 114, an input IN3 is connected to the junction setdrn, an input IN4 is connected to the junction resdrn, and an input POR is connected to a control circuit (not illustrated) so as to receive a power-on reset signal POR.

The level shift circuit includes the diodes D1 and D2 whose anodes are connected to the junction VS between the switching element XD1 and the switching element XD2. The cathode of the diode D1 is connected to the junction setdrn and the cathode of the diode D2 is connected to the junction resdrn. By doing so, the voltages of the junctions setdrn and resdrn are clamped by the diodes D1 and D2 so as not to exceed (fall below) the high-side reference potential VS and so prevent an overvoltage from being inputted into the latch malfunction protection circuit 112.

The low-side driving circuit 120 is equipped with the low-side driver 121 that drives the switching element XD2, and the power supply E2. The low-side driver 121 is supplied with power from the power supply E2, inputs a low-side control signal from a control apparatus, not illustrated, and outputs the output signal LO for on and off driving of the switching element XD2.

The output circuit 100 has the junction VS between the switching element XD1 and the switching element XD2, which is the output unit of the output circuit 100, connected to one end of the load L and the other end of the load L is connected to the ground potential (GND).

Next, specific examples of the logical AND circuit AND1, the logical AND circuit AND2, and the dV/dt period detection circuit 114 mentioned above will be described.

The logical AND circuit AND1 and the logical AND circuit AND2 have the same configuration. For this reason, in FIG. 2, the symbols of the terminals of the logical AND circuit AND2 corresponding to the logical AND circuit AND1 are indicated by parentheses. The logical AND circuit AND1 (AND2) has three P-channel MOSFET transistors PM11, PM12, and PM13, one N-channel MOSFET transistor NM11, and a resistor Rt. The transistors PM11 and PM12 have their sources and drains connected to each other, with the sources being connected to the power supply line VB. The gate of the transistor PM11 constructs an input connected to the output OUT1 (OUT2) of the dV/dt period detection circuit 114, and the gate of the transistor PM12 constructs an input connected to the junction setdrn (resdrn). The drains of the transistors PM11 and PM12 are connected via the resistor Rt to a line at the high-side reference potential VS. The junction between the drains of the transistor PM11, PM12 and the resistor Rt is connected to the gates of the transistors PM13 and NM11 that construct a CMOS (complementary metal-oxide-semiconductor) inverter circuit. The source of the transistor PM13 is connected to the power supply line VB, and the source of the transistor NM11 is connected to a line of the high-side reference potential VS. The drains of the transistors PM13 and NM11 are connected to each other and construct an output AND1_OUT (AND2_OUT) of the logical AND circuit AND1 (AND2).

One characteristic of the logical AND circuit AND1 (AND2) is that the load of the transistors PM11 and PM12 used for inputting are constructed by the resistor Rt. That is, a typical CMOS logical OR circuit is configured with the loads of the input transistors PM11 and PM12 connected in series to two N-channel MOSFET transistors, with the gates of these transistors being connected to the gates of the transistors PM11 and PM12. On the other hand, in the present embodiment, the loads of the transistors PM11 and PM12 used for inputting are constructed of the resistor Rt, and when the output of the CMOS inverter circuit of the transistors PM13 and NM11 is inverted from the L level to the H level, charge that has accumulated in the gate capacitances of the transistors PM13 and NM11 is slowly discharged by the resistor Rt. Accordingly, when an H level signal is applied simultaneously to both of the two inputs, instead of the logical state of the output AND1_OUT (AND2_OUT) immediately changing to the H level, the logical AND circuit AND1 (AND2) changes to the H level after a delay of a predetermined time. This delay time is changed by adjusting the value of the resistor Rt. Note that when the one of the two inputs becomes the L level in a state where the output is the H level, the output AND1_OUT (AND2_OUT) immediately becomes the L level.

As depicted in FIG. 3, the dV/dt period detection circuit 114 includes two latch circuits LT1, LT2, a comparator COMP1, resistors R1 and R2, a reference voltage Vref, and an OR circuit OR2.

A reset input R of the latch circuit LT1 and a set input S of the latch circuit LT2 are connected to the input IN1 of the dV/dt period detection circuit 114, and the set input S of the latch circuit LT1 and the reset input R of the latch circuit LT2 are connected to the input IN2 of the dV/dt period detection circuit 114. An inverted output ZQ of the latch circuit LT1 constructs the output OUT1 of the dV/dt period detection circuit 114 and an inverted output ZQ of the latch circuit LT2 constructs the output OUT2 of the dV/dt period detection circuit 114. The clear inputs CLR of the latch circuits LT1 and LT2 are connected to the output of the OR circuit OR2.

When one of the set input S and the reset input R is at the H level, the latch circuits LT1 and LT2 are set or reset depending on whether the input that has become the H level is the set input S or the reset input R. However, when the two inputs are simultaneously at the L level or at the H level, there is no change in state. Even when there is a slight discrepancy in the timing at which the two inputs simultaneously become the H level or the timing at which the inputs simultaneously change from the H level to the L level, there is no change in state due to the delay in response of the internal circuits.

The outputs OUT1 and OUT2 of the latch circuits LT1 and LT2 are signals obtained by inverting the states of the latch circuits LT1 and LT2, and when the clear input CLR is at the H level, the outputs OUT1 and OUT2 both become the H level.

The non-inverting input (+) of the comparator COMP1 is connected to a junction connected to one terminal of each of the resistor R1 and the resistor R2. The other terminal of the resistor R1 constructs the input IN3 of the dV/dt period detection circuit 114 and the other terminal of the resistor R2 constructs the input IN4 of the dV/dt period detection circuit 114. The inverting input (−) of the comparator COMP1 is connected to the positive terminal of the reference voltage Vref and the negative terminal of the reference voltage Vref is connected to the high-side reference potential VS. The output of the comparator COMP1 is connected to one input of the OR circuit OR2, and the other input of the OR circuit OR2 constructs the input POR of the dV/dt period detection circuit 114 which receives the power-on reset signal POR.

The circuit of the resistor R1 and R2 connected to the non-inverting input of the comparator COMP1 is a circuit that calculates a weighted average of the potential of the set drain signal setdrn and the potential of the reset drain signal resdrn. The weighted average calculated by this circuit is expressed by (setdrn×R2/(R1+R2))+(resdrn×R1/(R1+R2)).

When the resistance values of the resistors R1, R2 are equal, the weighted average is a simple average. In the present embodiment, R1=R2.

The reference voltage Vref that is inputted into the inverting input of the comparator COMP1 is a rather high value (i.e., a value near the potential VB). This means that in a state where dV/dt is applied to the high-side reference potential VS, the potential of the set drain signal setdrn and the potential of the reset drain signal resdrn will always be lower than the potential VB due to the potential drop across the resistors, so that the simple average of the two will not exceed the reference voltage Vref. Accordingly, in a state where dV/dt occurs, the comparator COMP1 will definitely output an L-level signal, so that the latch circuits LT1 and LT2 will not clear.

Next, an operation (normal operation) by the half-bridge circuit described above when the set signal SET is received from a control apparatus and the high-side switching element XD1 switches to the ON state will be described.

First, the high breakdown voltage transistor HVN1 is turned on, the set drain signal setdrn becomes the ground potential, the latch circuit 113 is set via the latch malfunction protection circuit 112, and the high-side driver 111 drives and turns on the switching element XD1. By doing so, the high-side reference potential VS switches from the ground potential to the high voltage E, and the potential VB of the power supply line VB of the high-side driving circuit 110 becomes the voltage (E+E1). At this time, since the high breakdown voltage transistor HVN1 is already off, the potential VB is applied via the level shift resistors LSR1 and LSR2 to the junctions setdrn and resdrn. When the potential VB is applied, due to the presence of the parasitic capacitances Cds1 and Cds2 of the high breakdown voltage transistors HVN1 and HVN2, the potentials of the junctions setdrn and resdrn fall to the ground potential for an instant and then start to rise to the potential VB. At this time, when there is a difference in the magnitudes of the parasitic capacitances Cds1 and Cds2, there will be a discrepancy in the timing at which the potentials rise, the condition for malfunction protection by the latch malfunction protection circuit 112 collapses, and there is the risk of the latch circuit 113 malfunctioning.

In this level shift circuit, the latch circuit 113 outputs the H-level signal, and until the switching element XD1 rises, an L level signal is inputted via the inverter circuit INV into the transistor PM2 to turn on the transistor PM2. At this time, since the potential at the junction resdrn is high, the logical OR circuit OR1 outputs an H-level signal, which turns off the transistors PM3 and PM4. Since the inputs IN1 and IN2 are at the L level and the H level, the outputs OUT1 and OUT2 respectively become the L level and the H level, and due to this, the logical AND circuits AND1 and AND2 respectively output an L level and an H-level signal, which turn off the transistor PM1X and turn on the transistor PM2X. As a result, the impedance Z2 of the parallel circuit that includes the level shift resistor LSR2 becomes lower than the impedance Z1 of the parallel circuit including the level shift resistor LSR1.

The switching element XD1 rises and the high-side reference potential VS becomes the high voltage E, and when the potential VB becomes the voltage (E+E1), charging of the parasitic capacitances Cds1 and Cds2 is started via the impedances Z1 and Z2 on the set side and the reset side. At this time, even when there is a difference in magnitude between the parasitic capacitances Cds1 and Cds2, the transistors PM2 and PM2X are both turned on, and since the impedance Z2 on the reset side is very low, the parasitic capacitance Cds2 will become completely charged first, so that the potential of the junction resdrn will rise first. Since the parasitic capacitance Cds1 on the set side is charged via the level shift resistor LSR1 after the high-breakdown voltage transistor HVN1 has been turned off, the junction setdrn rises after a delay. That is, since the difference between the series resistance of the transistor PM1 and PM1X and the series resistance of the transistors PM2 and PM2X is very large (both of the two transistors are on in one pair and are off in the other pair), even when there is a difference in magnitude between the parasitic capacitances Cds1 and Cds2, the influence of this difference will be negligible. Due to this, it is possible to suppress the influence of dV/dt noise (switching noise) that occurs when the high-side switching element XD1 is turned on.

Next, the operation of the level shift circuit when dV/dt noise is applied for an extended period to the high-side reference potential VS will be described with reference to FIG. 4. Note that in FIG. 4, the operation waveforms of the gates of the transistor PM3 and PM4, the gate of the transistor PM2X, the gate of the transistor PM1X, the high-side reference potential VS, the junction setdrn, the junction resdrn, and the output signal HO are depicted in order from the top. The initial values of the output of the latch circuit 113 and the output signal HO are at the L level. These operation waveforms change based on the high-side reference potential VS. In addition, it is assumed here that the parasitic capacitance Cds1 has a larger magnitude than the parasitic capacitance Cds2 (Cds1>Cds2).

First, when the switching elements XD1 and XD2 of the output circuit 100 are off before the dV/dt noise is applied, the high breakdown voltage transistors HVN1 and HVN2 are off and the latch circuit 113 outputs an L-level signal. Since the potential VB is applied via the level shift resistors LSR1 and LSR2, respectively, the junctions setdrn and resdrn are held at a high potential. In the dV/dt period detection circuit 114, the comparator COMP1 outputs an H level signal to clear the latch circuits LT1 and LT2, and the outputs OUT1 and OUT2 of the latch circuits LT1 and LT2 output an H-level signal. Due to this, since the logical AND circuits AND1 and AND2 respectively have two inputs at the H level, the logical AND circuits AND1 and AND2 output H level signals. Since their respective gates are at the H level (in FIG. 4, the state until time t1), the transistors PM1X, PM2X, PM3, and PM4 are off. Note that since the gate of the transistor PM1 that is connected in series to the transistor PM1X is at the L level, the transistor PM1 is on. Since the gate of the transistor PM2 that is connected in series to the transistor PM2X is at the H level due to the inverter circuit INV, the transistor PM2 is off.

At time t1, when +dV/dt noise is applied to the high-side reference potential VS line, first, current flows to the level shift resistors LSR1 and LSR2 and the potentials of the junctions setdrn and resdrn fall. Due to this, at the dV/dt period detection circuit 114, the comparator COMP1 outputs an L-level signal by reducing the weighted average of the potentials of the junctions setdrn and resdrn to a certain level (as one example, to around 95% of the potential VB) or below. When the potentials of the junctions setdrn and resdrn fall below the thresholds Vth_AND1 and Vth_AND2 of the logical AND circuits AND1 and AND2, the logical AND circuits AND1 and AND2 output L level signals. This results in the gates of the transistors PM1X and PM2X becoming the L level, which turns on the transistors PM1X and PM2X. At this time, since the transistor PM1 is on and the value of R in the CR circuit on the junction setdrn side is small (i.e., the on resistance level of the transistors PM1 and PM1X), the influence of dV/dt is small. On the other hand, on the side of the junction resdrn, since the value of R in the CR circuit is large (i.e., the value of the level shift resistor LSR2, due to the transistor PM2 being off), the influence of dV/dt becomes larger. Since the influence of dV/dt is large on the reset side, the level shift circuit is placed in a state that is resistant to unexpected set operations. That is, the value of R in the CR circuit on the reset side being very low (i.e., the on resistance level of a transistor) has an equal or larger effect than Cds1 being larger than Cds2. Note that since the thresholds Vth_AND1 and Vth_AND2 of the logical AND circuits AND1 and AND2 are not determined by the balance between the P-channel MOSFET and the N-channel MOSFET as is the case with a CMOS structure and are instead determined by the thresholds of the P-channel MOSFET transistors PM11 and PM12 that construct the logical AND circuits AND1 and AND2, the thresholds Vth_AND1 and Vth_AND2 have values close to the potential VB.

As time passes, the potentials of the junctions setdrn and resdrn fall further, and when both potentials fall below the threshold Vth_OR1 of the logical OR circuit OR1, the logical OR circuit OR1 outputs an L-level signal. By doing so, the gates of the transistors PM3 and PM4 become the L level, which turns on the transistors PM3 and PM4. By turning on the transistors PM3 and PM4, the parasitic capacitances Cds1 and Cds2 become charged by the impedances Z1 and Z2 to which the on resistances of the transistors PM3 and PM4 are connected in parallel. Since the impedances Z1 and Z2 on the set side and the reset side both become very small at this time, the charging of the parasitic capacitances Cds1 and Cds2 is completed in an instant and the potentials of the junctions setdrn and resdrn rise. When either of the potentials of the junctions setdrn and resdrn exceeds the threshold Vth_OR1 of the logical OR circuit OR1, the logical OR circuit OR1 outputs an H-level signal which turns off the transistors PM3 and PM4. That is, the transistors PM3 and PM4 are turned on for an instant immediately after dV/dt noise has been applied and the parasitic capacitances Cds1 and Cds2 are rapidly charged.

Even when the transistors PM3 and PM4 are turned on for an instant and the potentials of the junctions setdrn and resdrn rise, due to the continued application of dV/dt, the potentials of the junctions setdrn and resdrn again fall at time t2. These potentials fall such that the fall in the potential of the junction resdrn on the reset side that is greatly influenced by dV/dt is larger.

In this case, since the fall in the potential on the junction setdrn side is small and the parasitic capacitance Cds1 is charged by the low impedance Z1, the potential of the junction setdrn rises. Since the potential of the junction resdrn is inputted at the L level compared to the input threshold of the latch malfunction protection circuit 112, the latch malfunction protection circuit 112 does not block the signals where the junction setdrn is at the H level and the junction resdrn is at the L level. However, since it is the reset side that is at the L level, the level shift circuit keeps the output signal HO at the L level and a malfunction that would invert to the H level does not occur.

From time t2 onwards, due to the continued application of the dV/dt noise to the high-side reference potential VS, the relationship between the levels of the potential of the junction setdrn and the potential of the junction resdrn is maintained without changing.

When the potential of the junction setdrn reaches the threshold Vth_AND1 of the logical AND circuit AND1 at time t3, the output of the logical AND circuit AND1 becomes the H level. The output of the logical AND circuit AND2 at this time is the L level. This is because there is a change from an IN1=IN2=L level state to a state where IN1=H level and IN2=L level, and by inputting IN1=H level, IN2=L level signals into the latch circuits LT1 and LT2, the outputs OUT1 and OUT2 of the latch circuits LT1 and LT2 are determined respectively at the H level and the L level (the outputs of the latch circuits LT1 and LT2 do not change even when the output of the logical AND circuit AND2 later becomes the H level). Since the output OUT2 is determined at the L level, the output of the logical AND circuit AND2 is also determined at the L level, and even when the potential of the junction resdrn later becomes larger than the threshold Vth_AND2 of the logical AND circuit AND2, the output of the logical AND circuit AND2 does not become the H level and the on state of the transistor PM1X (that is, a state where the potential VB and the junction resdrn are connected by the on resistances of the transistors PM1 and PM1X) is maintained.

When the application of dV/dt noise to the high-side reference potential VS ends at time t4, the potentials of the junctions setdrn and resdrn rise. Note that in a state where the application of dV/dt noise continues, current continues to flow from the power supply E1 to the parasitic capacitances Cds1 and Cds2 (the potentials of the junctions between C and R in a CR circuit will definitely not catch up with rising voltage applied to the CR circuit), and a voltage drop will be produced by this current. On the set side also, although the transistors PM1 and PM1X are both on, since the on resistance is not zero, a voltage drop will be produced. Due to this, in the period where the dV/dt noise continues, the weighted average potential of the junctions setdrn and resdrn will be the reference voltage Vref or below (a value near the potential VB). When dV/dt ends, the difference in potential between the weighted average of the potentials of the junctions setdrn and resdrn and the potential VB disappears, so that these potentials finally become equal to the potential VB. This means that when the comparator COMP1 compares the weighted average of the potentials of the junctions setdrn and resdrn with the reference voltage Vref (a value near the potential VB) and determines that dV/dt has ended, an H-level signal is outputted. This signal is supplied via the logical OR circuit OR2 to the clear inputs CLR of the latch circuits LT1 and LT2 and the latch circuits LT1 and LT2 output H-level signals at the inverted outputs ZQ. Due to the outputs OUT1 and OUT2 of the dV/dt period detection circuit 114 becoming the H level, the two inputs of the logical AND circuits AND1 and AND2 both become the H level. Due to this, the outputs of the logical AND circuits AND1 and AND2 try to change to the H level.

However, by having the charge that has accumulated in the gate capacitances of the transistors PM13 and NM11 slowly released via the resistor Rt, the outputs of the logical AND circuits AND1 and AND2 become the H level after a predetermined delay time. Accordingly, the gates of the transistors PM1X and PM2X become the H level from the time t5 the predetermined delay time later, which turns off the transistors PM1X and PM2X.

As described above, by equipping the level shift circuit with the dV/dt period detection circuit 114, even if prolonged dV/dt noise is produced, it is possible to maintain the malfunction protection function for the latch circuit 113 until the occurrence of the dV/dt noise ends.

By equipping a level shift circuit with the configuration described above with the dV/dt period detection circuit, it is possible to cope with the occurrence of dV/dt noise over an extended period, resulting in the advantage of improving the resistance to malfunctions due to dV/dt. Since the level shift circuit becomes resistant to malfunctioning, the reliability of a half-bridge circuit that uses the level shift circuit is also improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A level shift circuit for shifting a level of a signal and transmitting the level-shifted signal to a circuit that drives a switching element on a high side of a half-bridge circuit, the circuit being connected to two ends of a power supply respectively via a power supply line and a reference potential line, the level shift circuit comprising:
    a first series circuit of a first resistor and a first transistor, the first series circuit being connected between the power supply line and a ground potential;
    a second series circuit of a second resistor and a second transistor, the second series circuit being connected between the power supply line and the ground potential;
    a latch malfunction protection circuit that receives a signal at a first junction between the first resistor and the first transistor, and a signal at a second junction between the second resistor and the second transistor;
    a latch circuit into which an output of the latch malfunction protection circuit is inputted;
    a third transistor and a fourth transistor that are connected to each other in series and are connected in parallel to the first resistor;
    a fifth transistor and a sixth transistor that are connected to each other in series and are connected in parallel to the second resistor;
    a switching time detection circuit that receives the signal at the first junction and the signal at the second junction and detects an occurrence of switching noise on the reference potential line;
    a first logical AND circuit that receives a first output of the switching time detection circuit and the signal at the first junction, and controls the sixth transistor; and
    a second logical AND circuit that receives a second output of the switching time detection circuit and the signal at the second junction, and controls the fourth transistor,
    wherein the third transistor is controlled by an output signal of the latch circuit and the fifth transistor is controlled by a signal produced by logically inverting the output signal of the latch circuit.

2. The level shift circuit according to claim 1, further comprising:
    a seventh transistor that is connected in parallel to the first resistor;
    an eighth transistor that is connected in parallel to the second resistor; and
    a logical OR circuit that receives the signal at the first junction and the signal at the second junction, and turns on the seventh transistor and the eighth transistor only when the signal at the first junction and the signal at the second junction have both fallen below an input threshold.

3. The level shift circuit according to claim 1, wherein the switching time detection circuit includes:
   a first latch circuit having a set input and a reset input, the first latch circuit receiving an output of the first logical AND circuit at the reset input thereof, and an output of the second logical AND circuit at the set input thereof, and setting an inverted output thereof as the first output;
   a second latch circuit having a set input and a reset input, the second latch circuit receiving the output of the second logical AND circuit at the reset input thereof, and the output of the first logical AND circuit at the set input thereof, and setting an inverted output thereof as the second output; and
   a comparator that has
   a first input to receive the signal at the first junction via a third resistor, and the signal at the second junction via a fourth resistor, and
   a second input connected to one end of a reference power supply, of which the other end is connected to the reference potential line,
the comparator clearing the first latch circuit and the second latch circuit when a weighted average of the signal at the first junction and the signal at the second junction exceeds a potential of the reference power supply.

4. The level shift circuit according to claim 3,
   wherein the first logical AND circuit includes:
      a first P channel transistor having a source, a gate and a drain, the source thereof being connected to the power supply line, the gate thereof receiving the first output of the switching time detection circuit, the first P channel transistor being controlled by the first output;
      a second P channel transistor having a source, a gate and a drain, a source thereof being connected to the power supply line, a gate thereof receiving the signal at the first junction, the second P channel transistor being controlled by the signal at the first junction;
      a fifth resistor that is connected between the reference potential line and the drains of the first and second P channel transistors;
      a third P channel transistor having a source, a gate and a drain, the source thereof being connected to the power supply line, the gate thereof being connected to a junction between the fifth resistor and the drains of the first and second P channel transistors; and
      a first N channel transistor having a source, a gate and a drain, the source thereof being connected to the reference potential line, the gate thereof being connected to the gate of the third P channel transistor, the drain thereof being connected to
   the drain of the third P channel transistor,
   a gate of the sixth transistor,
   the reset input of the first latch circuit, and
   the set input of the second latch circuit; and
   wherein the second logical AND circuit includes:
      a fourth P channel transistor having a source, a gate and a drain, the source thereof being connected to the power supply line, the gate thereof receiving the second output of the switching time detection circuit, the fourth P channel transistor being controlled by the second output;
      a fifth P channel transistor having a source, a gate and a drain, the source thereof being connected to the power supply line, the gate thereof receiving the signal at the second junction, the fifth P channel transistor being controlled by the signal at the second junction;
      a sixth resistor that is connected between the reference potential line and the drains of the fourth and fifth P channel transistors;
      a sixth P channel transistor having a source, a gate and a drain, the source thereof being connected to the power supply line, the gate thereof being connected to a junction between the sixth resistor and the drains of the fourth and fifth P channel transistors; and
      a second N channel transistor having a source, a gate and a drain, the source thereof being connected to the reference potential line, the gate thereof being connected to the gate of the sixth P channel transistor, the drain thereof being connected to
   the drain of the sixth P channel transistor,
   a gate of the fourth transistor,
   the set input of the first latch circuit, and
   the reset input of the second latch circuit.

* * * * *